United States Patent
Gandikota et al.

(10) Patent No.: US 12,020,982 B2
(45) Date of Patent: Jun. 25, 2024

(54) METAL BASED HYDROGEN BARRIER

(71) Applicant: Applied Materials, Inc., Santa Clara, CA (US)

(72) Inventors: Srinivas Gandikota, Santa Clara, CA (US); Steven C. H. Hung, Sunnyvale, CA (US); Srinivas D. Nemani, Sunnyvale, CA (US); Yixiong Yang, Fremont, CA (US); Susmit Singha Roy, Campbell, CA (US); Nikolaos Bekiaris, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/587,525

(22) Filed: Jan. 28, 2022

(65) Prior Publication Data
US 2022/0157654 A1 May 19, 2022

Related U.S. Application Data

(62) Division of application No. 16/876,293, filed on May 18, 2020, now abandoned.
(Continued)

(51) Int. Cl.
*H01L 21/768* (2006.01)
*H01L 23/48* (2006.01)

(52) U.S. Cl.
CPC .. *H01L 21/76864* (2013.01); *H01L 21/76898* (2013.01); *H01L 23/481* (2013.01)

(58) Field of Classification Search
CPC ..... H01L 21/67; H01L 21/285; H01L 21/768; H01L 21/67167; H01L 21/28556;
(Continued)

(56) References Cited

U.S. PATENT DOCUMENTS 6,528,409 B1 * 3/2003 Lopatin ............. H01L 21/76865
438/653
2003/0075804 A1 * 4/2003 Gleixner ................. H01L 24/48
257/762
(Continued)

FOREIGN PATENT DOCUMENTS

KR 20070061451 A 6/2007
KR 20070078348 A 7/2007
(Continued)

OTHER PUBLICATIONS

"Imec Develops 3D-Compatible Germanium nMOS Gate stack with High Mobility and Superior Reliability", Accessed at https://www.imec-int.com/en/articles/imec-develops-3d-compatible-germanium-nmos-gate-stack-with-high-mobility-and-superior-reliability, Apr. 30, 2019.
(Continued)

*Primary Examiner* — Chuong A Luu
(74) *Attorney, Agent, or Firm* — Servilla Whitney LLC

(57) ABSTRACT

A method of forming an electronic device is disclosed. The method comprises forming depositing a metal on a substrate, the metal comprising one or more of copper (Cu), titanium (Ti), or tantalum (Ta). A metal cap is deposited on the metal. The metal cap comprises one or more of molybdenum (Mo), ruthenium (Ru), iridium (Ir), rhodium (Rh), palladium (Pd), silver (Ag), osmium (Os), platinum (Pt), or gold (Au). The substrate is then exposed to an anneal process, e.g., a hydrogen high-pressure anneal. The formation of the metal cap on the metal minimizes parasitic adsorption of hydrogen by the underlying metal.

14 Claims, 3 Drawing Sheets

Related U.S. Application Data

(60) Provisional application No. 62/852,363, filed on May 24, 2019.

(58) Field of Classification Search
CPC ......... H01L 21/76864; H01L 21/76898; H01L 21/76849; H01L 21/76847; H01L 21/76877; H01L 23/48; H01L 23/481; H01L 23/532; H01L 23/53238; H01L 23/53266
USPC .......................................... 438/627, 643, 653
See application file for complete search history.

(56) References Cited

U.S. PATENT DOCUMENTS

| | | | | |
|---|---|---|---|---|
| 2008/0001290 | A1* | 1/2008 | Chou | ................ H01L 23/53252 257/E23.079 |
| 2009/0127604 | A1 | 5/2009 | Noda | |
| 2009/0130843 | A1* | 5/2009 | Suzuki | ............. H01L 21/28562 438/653 |
| 2010/0078693 | A1 | 4/2010 | Nakao | |
| 2013/0075734 | A1 | 3/2013 | Cain et al. | |
| 2013/0137233 | A1 | 5/2013 | Czabaj et al. | |
| 2016/0141391 | A1 | 5/2016 | Merckling et al. | |
| 2018/0254179 | A1 | 9/2018 | Chan et al. | |

FOREIGN PATENT DOCUMENTS

| | | |
|---|---|---|
| TW | 201504483 A | 2/2015 |
| TW | 201842219 A | 12/2018 |

OTHER PUBLICATIONS

"PCT International Search Report and Written Opinion in PCT/US2020/033625 dated Sep. 4, 2020, 11 pages".

* cited by examiner

METAL BASED HYDROGEN BARRIER

CROSS-REFERENCE TO RELATED APPLICATIONS

This application is a Divisional of U.S. application Ser. No. 16/876,293, filed May 18, 2020, which claims priority to U.S. Provisional Application No. 62/852,363, filed May 24, 2019, the entire disclosures of which are hereby incorporated by reference herein.

TECHNICAL FIELD

Embodiments of the present disclosure generally relate method of manufacturing electronic devices. More particularly, embodiments provide electronic devices and methods of blocking hydrogen from diffusing into underlying materials of a semi-conductor device.

BACKGROUND

Semiconductor technology has advanced at a rapid pace and device dimensions have shrunk with advancing technology to provide faster processing and storage per unit space. As semiconductor technology advances, the market demands increasing smaller chips with increasingly more structures per unit area.

Reducing the size of integrated circuits (ICs) results in improved performance, increased capacity, and/or reduced cost. Each size reduction requires more sophisticated techniques to form the ICs. Shrinking transistor size, for example, allows for the incorporation of an increased number of memory or logic devices on a chip, lending to the fabrication of products with increased capacity. The drive for ever-more capacity, however, is not without issue. The necessity to optimize the performance of each device becomes increasingly significant.

Hydrogen ($H_2$) absorption or incorporation into active layers of logic or memory devices can lead to drastic changes in properties of the active layers, resulting in deleterious effects on the device performance. Thus, the ability to control hydrogen incorporation would be beneficial for logic and memory applications.

Therefore, there is a need for methods of controlling the adsorption of hydrogen by underlying materials on a semi-conductor device.

SUMMARY

One or more embodiments of the disclosure are directed to an electronic device. In one or more embodiments, an electronic device comprises a metal on a substrate, the metal comprising one or more of copper (Cu), titanium (Ti), or tantalum (Ta); and a metal cap on the metal, the metal cap comprising one or more of ruthenium (Ru), iridium (Ir), rhodium (Rh), palladium (Pd), silver (Ag), osmium (Os), platinum (Pt), or gold (Au).

One or more embodiments of the disclosure are directed to a method of manufacturing an electronic device. In one or more embodiments, the method comprises depositing a metal on a substrate, the metal comprising one or more of copper (Cu), titanium (Ti), or tantalum (Ta); depositing a metal cap on the metal, the metal cap comprising one or more of ruthenium (Ru), iridium (Ir), rhodium (Rh), palladium (Pd), silver (Ag), osmium (Os), platinum (Pt), or gold (Au); and optionally exposing the substrate to an anneal process.

One or more embodiments of the disclosure are directed to a processing tool. In one or more embodiments, the processing tool comprises a central transfer station comprising at least one robot configured to move a wafer; a plurality of process stations, each process station connected to the central transfer station and providing a processing region separated from processing regions of adjacent process stations, the plurality of process stations comprising one or more of a metal deposition chamber and a metal cap deposition chamber; an optional pre-clean station connected to the central transfer station; and a controller connected to the central transfer station and the plurality of process stations, the controller configured to activate the robot to move the wafer between process stations, and to control a process occurring in each of the process stations.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
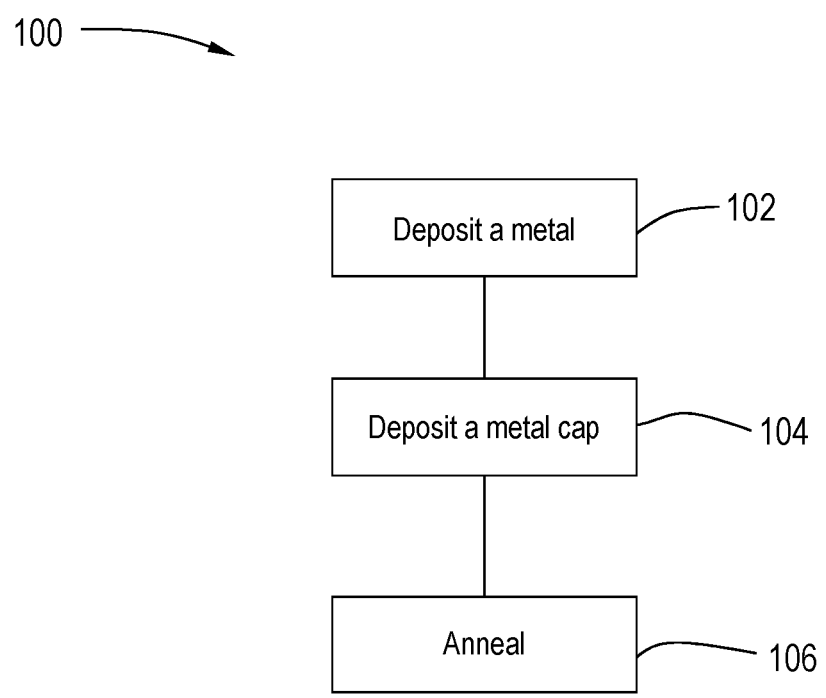
FIG. 1 is a flow chart of a method of forming an electronic device according to one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "about" as used herein means approximately or nearly and in the context of a numerical value or range set forth means a variation of ±15%, or less, of the numerical value. For example, a value differing by ±14%, ±10%, ±5%, ±2%, or ±1%, would satisfy the definition of about.

As used in this specification and the appended claims, the term "substrate" or "wafer" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

Some embodiments of the present disclosure relate to methods for forming an electronic device. Some methods of this disclosure advantageously provide methods for forming a metal cap on a metal. The formation of the metal cap on the metal advantageously minimizes parasitic adsorption of hydrogen by the underlying metal. Some methods of this disclosure advantageously provide for forming a metal cap resulting in reduced defects and improved electrical properties.

Referring to FIG. 1, which is a process flow diagram, the method 100 of forming an electronic device begins at operation 102 by depositing a metal on a substrate. At operation 104, a metal cap is deposited on the metal. At operation 106, the substrate is exposed to an anneal process.

Figure 2A:
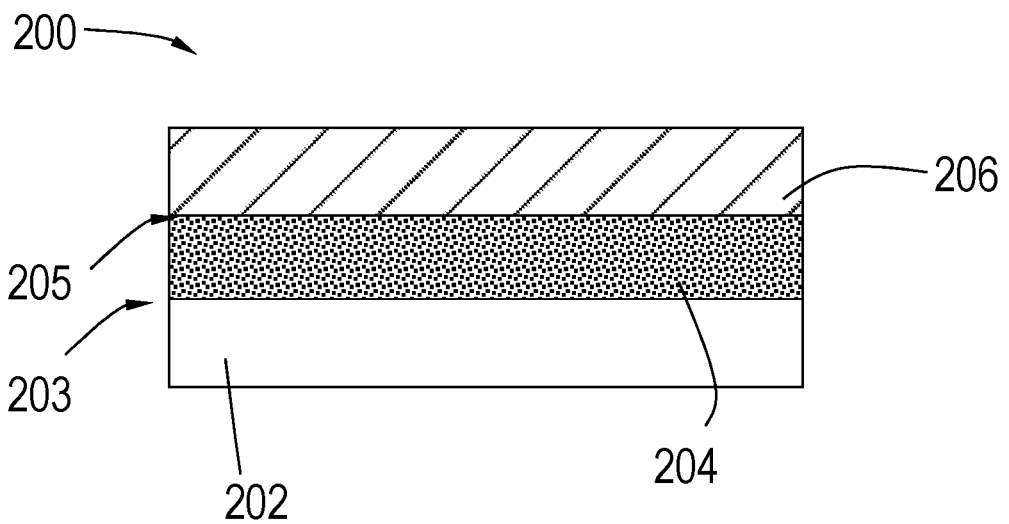
FIG. 2A illustrates an exemplary electronic device according to one or more embodiments of the disclosure.
Figure 2B:
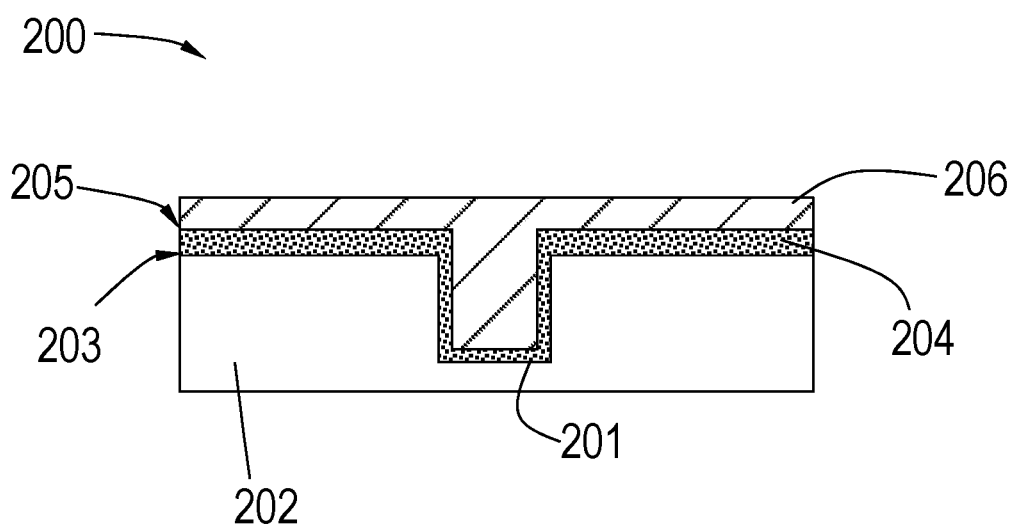
FIG. 2B illustrates an exemplary electronic device according to one or more embodiments of the disclosure.

FIGS. 2A and 2B are cross-section views of an electronic device 200 according to one or more embodiments. With reference to FIG. 2A, an electronic device comprises a substrate 202 having a top surface 203.

The semiconductor substrate 202 can be any suitable substrate material. In one or more embodiments, the semiconductor substrate 202 comprises a semiconductor material, e.g., silicon (Si), carbon (C), germanium (Ge), silicon germanium (SiGe), gallium arsenide (GaAs), indium phosphate (InP), indium gallium arsenide (InGaAs), indium aluminum arsenide (InAlAs), germanium (Ge), silicon germanium (SiGe), copper indium gallium selenide (CIGS), other semiconductor materials, or any combination thereof. In one or more embodiments, the semiconductor substrate 202 comprises one or more of silicon (Si), germanium (Ge), gallium (Ga), arsenic (As), indium (In), phosphorus (P), copper (Cu), or selenium (Se). Although a few examples of materials from which the substrate 202 may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

Referring to FIG. 2B, in some embodiments, the substrate 202 has at least one feature 201 formed thereon. In one or more embodiments, the feature 201 is selected from one or more of a trench, a via, a fin, or a peak. In the embodiment illustrated in FIG. 2B, the feature 201 is a trench.

With reference to FIGS. 2A and 2B, a metal 204 is formed on the top surface 203 of the substrate 202. In one or more embodiments, formation of the metal 204 is conducted by any suitable process known to the skilled artisan, including, but not limited to ALD, CVD, PVD, MBE, MOCVD, spin-on, or other insulating layer deposition techniques known to the skilled artisan.

In one or more embodiments, the metal 204 comprises one or more of copper (Cu), titanium (Ti), or tantalum (Ta). In the embodiment illustrated in FIG. 2B, the metal 204 is a liner. In one or more embodiments, the liner may comprise one or more of titanium nitride (TiN) or tantalum nitride (TaN).

In some embodiments, as illustrated in FIG. 2B, the metal 204 is substantially conformal to the surface 203 of the substrate 202. As used herein, a layer which is "substantially conformal" refers to a layer where the thickness is about the same throughout (e.g., on the top, middle and bottom of sidewalls and on the bottom of the gap). A layer which is substantially conformal varies in thickness by less than or equal to about 10%, 5%, 2%, 1% or 0.5%.

In some embodiments, the substrate 202 may have a three dimensional feature 201 formed thereon.

In one or more embodiments, a metal cap 206 is deposited on the metal 204. In one or more embodiments, formation of the metal cap 206 is conducted by any suitable process known to the skilled artisan, including, but not limited to ALD, CVD, PVD, MBE, MOCVD, spin-on, or other insulating layer deposition techniques known to the skilled artisan. In one or more embodiments, the metal cap 206 comprises one or more of molybdenum (Mo), ruthenium (Ru), iridium (Ir), rhodium (Rh), palladium (Pd), silver (Ag), osmium (Os), platinum (Pt), or gold (Au). In one or more specific embodiment, the metal cap 206 comprises one or more of iridium (Ir), molybdenum (Mo), or ruthenium (Ru). In one or more very specific embodiment, the metal cap 206 comprises ruthenium (Ru).

Without intending to be bound by theory, it is thought that hydrogen ($H_2$) is difficult to block because of its small molecular size. It has been advantageously found that ruthenium (Ru), iridium (Ir), rhodium (Rh), palladium (Pd), silver (Ag), osmium (Os), platinum (Pt), and gold (Au) show evidence of blocking hydrogen from adsorbing into metals.

In one or more embodiments, the metal cap has a thickness in a range of about 5 Å to about 500 Å.

In some embodiments, the metal cap 206 is substantially conformal to the surface of the metal 204.

Without intending to be bound by theory, it is thought that the interface of the metal cap 206 and the underlying metal 204 is superior, as defined by a lower percentage of hydrogen (H2) being incorporated into the metal 204, when compared to an electronic device that does not have a metal cap 206.

In one or more embodiments, after the metal cap 206 is deposited on the metal 204, the electronic device 200 or the substrate 202 is subjected to an anneal process. In one or more embodiments, the anneal process can be after the complete fabrication of the semiconductor device or at intermediate steps. In one or more embodiments, complete device fabrication can be broadly described as transistor fabrication, contact metallization, and multiple levels of metallization. In one or more embodiments, the anneal process is selected from a sub-atmospheric anneal, a vacuum anneal, an anneal process above atmospheric pressures, or a high-pressure hydrogen anneal in order to improve the liability of the transistor.

In one or more embodiments, the high-pressure hydrogen anneal is conducted at a temperature of about 500° C., at a pressure of about 30 Barr to 120 Barr hydrogen for 1 hour. In one or more embodiments, during the anneal process, the metal cap 206 absorbs less than about 3% of hydrogen ($H_2$), including less than about 2%, less than about 1%, and less than about 0.5%.

Figure 3:
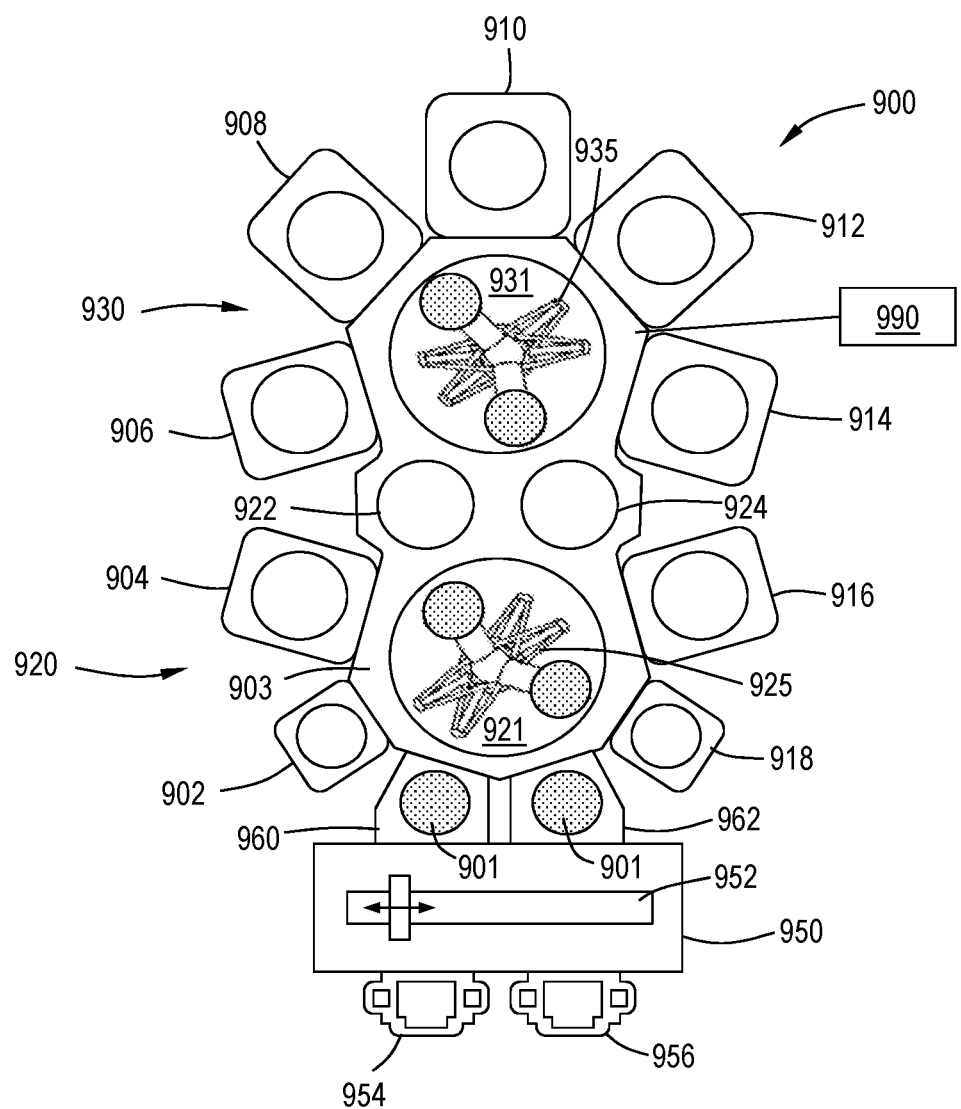
FIG. 3 illustrates a cluster tool according to one or more embodiments of the disclosure.

Additional embodiments of the disclosure are directed to processing tools 900 for the formation of the memory devices and methods described, as shown in FIG. 3.

The cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station. The various processing chambers provide separate processing regions isolated from adjacent process stations. The processing chamber can be any suitable chamber including, but not limited to, a preclean chamber, a buffer chamber, transfer space(s), a wafer orienter/degas chamber, a cryo cooling chamber, a deposition chamber, an annealing chamber, an etching chamber, and an atomic layer deposition (ALD) chamber. The particular arrangement of process chambers and components can be varied depending on the cluster tool and should not be taken as limiting the scope of the disclosure.

In one or more embodiments, the cluster tool 900 includes a metal chamber to deposit a metal, and a metal cap chamber to deposit a metal cap. The metal and/or metal cap deposition chambers of some embodiments comprises an atomic layer deposition chamber, a plasma enhanced atomic layer deposition chamber, or a spatial atomic layer deposition chamber. In one or more embodiments, the cluster tool 900 includes a pre-cleaning chamber connected to the central transfer station.

In the embodiment shown in FIG. 3, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock 962 and the unloading chamber 956.

The cluster tool 900 shown has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In one or more embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930, or allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit, memory, suitable circuits and storage.

Processes may generally be stored in the memory of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In one or more embodiments, the processing tool 900 comprises a central transfer station 921, 931 comprising at least one robot 925, 935 configured to move a wafer; one or more processing station connected to the central transfer station; an atomic layer deposition (ALD) station connected to the central transfer station; an annealing station; and at least one controller connected to the one or more processing station, the ALD station or the optional pre-clean station. In one or more embodiments, the at least one controller has at least one configuration selected from: a configuration to move the wafer between stations using the robot; a configuration to deposit a metal by atomic layer deposition; a configuration to deposit a metal cap by atomic layer deposition; and a configuration to perform an anneal of the substrate.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of manufacturing an electronic device, the method comprising:
    depositing a metal liner on a substrate, the metal liner comprising one or more of copper (Cu), titanium (Ti), or tantalum (Ta);
    depositing a metal cap directly on the metal liner, the metal cap comprising one or more of molybdenum (Mo), ruthenium (Ru), iridium (Ir), rhodium (Rh), palladium (Pd), silver (Ag), osmium (Os), platinum (Pt), or gold (Au); and
    exposing the substrate to a high-pressure hydrogen anneal process conducted at a temperature of about 500° C. and a pressure in a range of about 30 Barr to 120 Barr hydrogen for 1 hour; wherein the metal cap absorbs less than about 3% of hydrogen (Hz) during the high-pressure hydrogen anneal process.

2. The method of claim 1, wherein the substrate comprises one or more of comprising one or more of silicon (Si), germanium (Ge), gallium (Ga), arsenic (As), indium (In), phosphorus (P), selenium (Se), or tungsten (W).

3. The method of claim 1, wherein the substrate has at least one feature formed thereon.

4. The method of claim 3, wherein the feature is selected from one or more of a trench, a via, a fin, or a peak.

5. The method of claim 4, wherein the feature is a trench.

6. The method of claim 1, wherein the metal liner is selected from one or more of titanium nitride (TiN) or tantalum nitride (TaN).

7. The method of claim 6, wherein the metal liner is substantially conformal to a surface of the substrate.

8. The method of claim 1, wherein the metal cap comprises one or more of molybdenum (Mo), ruthenium (Ru), or iridium (Ir).

9. The method of claim 8, wherein the metal cap comprises ruthenium (Ru).

10. The method of claim 1, wherein the metal cap has a thickness in a range about 5 Å to about 500 Å.

11. The method of claim 1, wherein the metal cap is substantially conformal to a surface of the metal liner.

12. The method of claim 1, wherein the substrate is exposed to the high-pressure hydrogen anneal process after depositing the metal liner on the substrate.

13. The method of claim 1, wherein the substrate is exposed to the high-pressure hydrogen anneal process after depositing the metal cap on the metal liner.

14. The method of claim 1, wherein the substrate is exposed to the high-pressure hydrogen anneal process after complete manufacture of the electronic device.

\* \* \* \* \*